US008223997B2

(12) United States Patent
Wilson, II et al.

(10) Patent No.: US 8,223,997 B2
(45) Date of Patent: Jul. 17, 2012

(54) WATERPROOF ENCLOSURE FOR AUDIO DEVICE

(75) Inventors: Ron Wilson, II, San Diego, CA (US);
Carl Pettersen, San Diego, CA (US);
Kristian Rauhala, Solana Beach, CA (US); Pete Dirksing, San Diego, CA (US); Cory McCluskey, San Diego, CA (US); Jim Pena, Encinitas, CA (US)

(73) Assignee: H2O Audio, Inc., San Diego, CA (US)

( * ) Notice: Subject to any disclaimer, the term of this patent is extended or adjusted under 35 U.S.C. 154(b) by 993 days.

(21) Appl. No.: 12/187,223

(22) Filed: Aug. 6, 2008

(65) Prior Publication Data
US 2010/0006314 A1 Jan. 14, 2010

Related U.S. Application Data

(60) Provisional application No. 61/080,147, filed on Jul. 11, 2008.

(51) Int. Cl.
*H05K 5/06* (2006.01)
(52) U.S. Cl. ........................................ 381/189; 174/505
(58) Field of Classification Search ................ 381/189, 381/388; 224/576; 174/50.5
See application file for complete search history.

(56) References Cited

U.S. PATENT DOCUMENTS

| | | |
|---|---|---|
| 2,517,138 A | 8/1950 | Seabert |
| 2,733,774 A | 2/1956 | Pessel |
| 3,670,299 A | 6/1972 | Kahn |
| 3,764,966 A | 10/1973 | Abbagnaro |
| 3,803,547 A | 4/1974 | Massa |
| 4,273,969 A | 6/1981 | Foley et al. |
| 4,281,343 A | 7/1981 | Monteiro |
| 4,336,537 A | 6/1982 | Strickland |
| 4,381,144 A | 4/1983 | Breslau |
| 4,456,797 A | 6/1984 | Olsen |
| 4,465,189 A | 8/1984 | Molzan |

(Continued)

FOREIGN PATENT DOCUMENTS

GB   2290696 A   1/1996

(Continued)

OTHER PUBLICATIONS

2005, Sakar's new "sound cases" put speakers in the bag, *PR Newswire US*, Jan. 6, 2005.

(Continued)

*Primary Examiner* — Zandra Smith
*Assistant Examiner* — Lawrence Tynes, Jr.
(74) *Attorney, Agent, or Firm* — Knobbe Martens Olson & Bear LLP (57) ABSTRACT

Disclosed herein is a waterproof case for protecting electronic devices. The waterproof case includes a flexible waterproof bag attached to a rigid lid that can be opened to allow electronic devices to pass into the bag. When closed, the lid forms a watertight seal that protects the inside of the bag from ingress of water. The lid can include a pass-through jack which allows a user to connect an electronic device, such as an audio device, to an output through the lid. The case may also be incorporated into a flexible attachment system, such as an armband or swimbelt. Methods of connecting an electronic device to an electronic output, such as an audio output, through a waterproof case are also provided.

25 Claims, 9 Drawing Sheets

U.S. PATENT DOCUMENTS

| | | | |
|---|---|---|---|
| D278,761 S | 5/1985 | Fuller |
| 4,562,590 A | 12/1985 | DeLage |
| 4,584,718 A | 4/1986 | Fuller |
| 4,646,872 A | 3/1987 | Kamon et al. |
| 4,682,363 A | 7/1987 | Goldfarb et al. |
| 4,683,587 A | 7/1987 | Silverman |
| 4,727,599 A | 2/1988 | Rappaport et al. |
| 4,771,299 A | 9/1988 | Gell |
| 4,839,871 A | 6/1989 | Massey |
| 4,856,087 A | 8/1989 | Nesbit |
| 4,949,806 A | 8/1990 | Hofer |
| 5,087,934 A | 2/1992 | Johnson |
| 5,136,555 A | 8/1992 | Gardos |
| 5,142,508 A | 8/1992 | Mitchell et al. |
| 5,224,473 A | 7/1993 | Bloomfield |
| 5,239,323 A | 8/1993 | Johnson |
| 5,258,592 A | 11/1993 | Nishikawa et al. |
| 5,285,894 A | 2/1994 | Kamata et al. |
| 5,294,988 A | 3/1994 | Wakabayashi et al. |
| 5,325,139 A | 6/1994 | Matsumoto |
| 5,337,364 A | 8/1994 | Fitch |
| 5,386,084 A | 1/1995 | Risko |
| 5,456,377 A | 10/1995 | Williams |
| 5,533,637 A | 7/1996 | Williams |
| 5,533,737 A | 7/1996 | Borowski |
| 5,537,667 A | 7/1996 | Kenning et al. |
| 5,570,688 A | 11/1996 | Cochran et al. |
| 5,579,284 A | 11/1996 | May |
| 5,586,176 A | 12/1996 | Peck |
| 5,600,730 A | 2/1997 | Kenning et al. |
| 5,610,655 A | 3/1997 | Wakabayashi et al. |
| 5,627,903 A | 5/1997 | Porrazzo et al. |
| D385,289 S | 10/1997 | Tsui |
| 5,706,251 A | 1/1998 | May |
| 5,759,044 A | 6/1998 | Redmond |
| 5,790,683 A | 8/1998 | Salzani |
| 5,797,683 A | 8/1998 | Gunzi et al. |
| 5,822,180 A | 10/1998 | Deschamps et al. |
| 5,825,718 A | 10/1998 | Ueki et al. |
| D404,749 S | 1/1999 | Tsui |
| 5,889,730 A | 3/1999 | May |
| 5,896,453 A | 4/1999 | Speaks |
| 6,042,416 A | 3/2000 | Lopes |
| 6,188,773 B1 | 2/2001 | Murata et al. |
| 6,396,769 B1 | 5/2002 | Polany |
| 6,545,948 B1 | 4/2003 | Jiang |
| 6,614,722 B2 | 9/2003 | Polany et al. |
| 6,646,864 B2 | 11/2003 | Richardson |
| 6,681,022 B1 | 1/2004 | Puthuff et al. |
| 6,785,566 B1 | 8/2004 | Irizarry |
| 6,821,018 B1 | 11/2004 | Denko |
| 6,832,712 B2 | 12/2004 | Turner |
| 6,931,339 B1 | 8/2005 | Olstad et al. |
| 6,954,405 B2 | 10/2005 | Polany et al. |
| 7,006,651 B2 | 2/2006 | Ueki |
| 7,230,823 B2 | 6/2007 | Richardson et al. |
| 7,263,032 B2 | 8/2007 | Polany et al. |
| D550,210 S | 9/2007 | Polany et al. |
| 7,312,984 B2 | 12/2007 | Richardson et al. |
| 2002/0069871 A1 | 6/2002 | Palazzotto et al. |
| 2002/0098874 A1 | 7/2002 | Zirul et al. |
| 2002/0197064 A1 | 12/2002 | Bijsmans et al. |
| 2003/0045235 A1 | 3/2003 | Mooney et al. |
| 2004/0112143 A1 | 6/2004 | Richardson |
| 2005/0030707 A1 | 2/2005 | Richardson et al. |
| 2005/0116003 A1 | 6/2005 | Butler et al. |
| 2005/0174727 A1 | 8/2005 | Thomas et al. |
| 2005/0242143 A1* | 11/2005 | Hassett .................. 224/576 |
| 2005/0254778 A1 | 11/2005 | Pettersen et al. |
| 2006/0185062 A1 | 8/2006 | Peng et al. |
| 2006/0200889 A1 | 9/2006 | Newman |
| 2007/0086273 A1 | 4/2007 | Polany et al. |
| 2007/0215663 A1 | 9/2007 | Chongson et al. |
| 2007/0241012 A1 | 10/2007 | Latchford et al. |
| 2007/0261978 A1 | 11/2007 | Sanderson |
| 2007/0280053 A1* | 12/2007 | Polany et al. .......... 367/131 |

FOREIGN PATENT DOCUMENTS

| | | | |
|---|---|---|---|
| JP | 59144297 A | 8/1984 |
| JP | 07298383 A | 11/1995 |
| JP | 2003174109 | 12/2004 |
| JP | 2007/242305 | 9/2007 |
| WO | WO 2005/012112 A2 | 2/2005 |

OTHER PUBLICATIONS

2004, Fit Phone, *The Warsaw Voice*, May 16, 2004.

1944, "Loudspeaker installation at Liverpool Street Station," *Engineering* (London) 157(4075):140.

Eagle Eye Outfitters Limited Literature in 1 page, accessed online Apr. 8, 2009—http://www.eagleeyecanada.com/Outbound-Watertight_Program.html.

Gray Ghost Underwater Headphones Literature in 2 pages, accessed online Mar. 21, 2007, www.detectorpro.com/grayghost-underwater.htm.

International Search Report and Written Opinion for PCT/US2005/015874 dated Aug. 22, 2005.

Hugus, Dec. 1974, "Pressure-compensating systems for underwater gas-filled electro-acoustic transducers," *Naval Res. Lab. NRL-MR* Report No. 2955, Washington, DC, 11 pp.

Nishimura et al., Apr. 21, 2002, "Development of a diaphragm for a planar acoustic transducer," *Furukawa Review* 21:62-68.

Office Action dated Apr. 26, 2004 received in U.S. Appl. No. 10/629,315.

Olson et al., Dec. 1947, "Underwater sound transducers," *RCA Review* 8: 698-718.

Sebesta et al., Oct. 4, 1965, "An inertial, tissue-contact type microphone-reproducer unit for deep submergence communications," *Journal of the Audio Engineering Society* 13(4):303-306.

Shinkoda et al., Aug. 1996, "New shape waterproof speaker for vehicles," *National Technical Report* 42(4):115-122, Japan.

Staff, 2005, "Sakar storage lets the sound out of the bag," *Twice* Feb. 21, 2005, p. 60.

Waterproof Cases.net Literature in 2 pages, accessed online Apr. 8, 2009—www.waterproofcases.net.

Waterproof iPod / MP3 Player Case Literature in 2 pages, accessed online Apr. 8, 2009—http://www.waterproof-paper.com/cases/waterproof-ipod-case.shtml.

Watertight Storage Case Company Literature in 9 pages, accessed online Apr. 8, 2009—http://www.watertightcase.com/reviews.html.

* cited by examiner

WATERPROOF ENCLOSURE FOR AUDIO DEVICE

CROSS-REFERENCE TO RELATED APPLICATIONS

This application claims the benefit of U.S. Provisional Application No. 61/080,147, filed on Jul. 11, 2008, the disclosure of which is incorporated herein by reference in its entirety.

BACKGROUND OF THE INVENTION

1. Field of the Invention

This invention relates in general to water resistant and waterproof audio systems for delivering audio to a user in aquatic environments.

2. Description of the Related Art

Portable electronic devices have become a part of everyday lives. The use of portable electronics during sporting activities has become extremely common. Some examples include the use of the Apple® iPod® portable audio player for music, or the use of a mobile phone, during exercise. Various accessories are available which allow these devices to be taken into basic sporting and even extreme sporting environments. These accessories include basic Nylon® and Neoprene® armbands as well as protective housings such as H2O Audio® waterproof cases designed to protect the devices during use in and around the water.

SUMMARY OF THE INVENTION

In one embodiment of the invention, a waterproof enclosure is adapted to receive a first electronic device. The enclosure includes a flexible waterproof bag, a rigid frame attached to the bag, and a rigid cover operatively coupled to the rigid frame. The rigid frame defines an opening larger than a cross-section of the first electronic device. The cover is movable between an open position, in which the cover is disposed away from the opening, and a closed position, in which the cover forms a waterproof seal with the frame. In one aspect of the embodiment, the enclosure further comprises a water resistant electronic communication link passing through at least one of the frame and the cover, the link being configured to allow an electronic connection between the first electronic device when it is placed inside the bag and a second electronic device disposed outside of the bag. In such an aspect, the electronic communication link can be an audio communication link. In such an aspect, the electronic communication link can pass through the frame and/or the cover. In such an aspect, the second electronic device can be a waterproof headset. In such an aspect, the cover can include an audio jack connected to the electronic communication link. In such an aspect, the bag can include at least one generally planar wall, the frame being substantially coplanar with the wall. In such an aspect, an outer portion of the electronic communication link can be recessed in an outer portion of the cover. In such an aspect, the waterproof enclosure can include a cable extending from an inner portion of the electronic communication link, the cable being configured to allow connection of the electronic device to the electronic connection link while the cover can be in the open position, before the electronic device can be received in the bag. The cable can comprise an audio plug. In some aspects of this embodiment, the bag comprises polyurethane, PVC, and/or silicone. In some aspects of the embodiment, the frame can comprise a flange. In such an aspect, the cover can include a skirt which, when the cover can be in the closed position, cooperates with the flange to reinforce the waterproof seal. In some aspects of the embodiment, the frame can be RF welded, heat sealed, and/or clamped to the bag. In some aspects of the embodiment, an adhesive can be disposed between the frame and the bag. In some aspects of the embodiment, one or more fasteners can secure the frame to the bag. In one aspect of the embodiment, the cover is coupled to the frame by a hinge. In another aspect, the cover is coupled to the frame by a tether. In another aspect, the enclosure further includes a latch configured to hold the cover in the closed position. In such an aspect, the latch can be configured to lock the cover in the closed position.

In another embodiment of the invention, a wearable article includes the waterproof enclosure described above. In one aspect of the embodiment, the article is an armband. In one aspect of the embodiment, the article is a waistbelt. In one aspect of the embodiment, the article is a shirt. In one aspect of the embodiment, the article is a wetsuit. In another aspect of the embodiment, the article further includes a protective member configured to protect the waterproof enclosure from impact.

In another embodiment of the invention, a waterproof housing is adapted to receive an electronic audio device. The housing includes means for flexibly protecting the electronic audio device from exposure to water and for allowing a user to interact with the device, the protecting means having an opening for receiving the electronic audio device into the protecting means. The housing also includes means for forming a waterproof seal at the opening, the sealing means being coupled to the protecting means. The housing further includes means for conveying an electrical signal through the sealing means from inside the protecting means to outside the protecting means.

In another embodiment of the invention, a method of facilitating use of an electronic audio device while protecting it from exposure to water is provided. The method includes providing a waterproof housing which includes a flexible bag with an opening and a rigid lid configured to seal the opening, at least a portion of the lid being stationary with respect to the bag, at least a portion of the lid being movable with respect to the bag between an open position and a closed position, the lid comprising a waterproof pass-through jack. The method further includes connecting the electronic audio device to the pass-through jack. The method further includes placing the electronic audio device in the waterproof housing.

BRIEF DESCRIPTION OF THE DRAWINGS

The features and advantages of the present invention, and a manner of attaining them, will become more apparent by reference to the following descriptions of one embodiment of the invention. The following drawings represent one means of attaining the invention disclosed herein, and should in no way be construed as limiting the scope of the invention claimed.

DETAILED DESCRIPTION OF THE PREFERRED EMBODIMENT

The advent of miniaturized electronic devices such as audio players and communication equipment has made feasible the individual use of such devices during recreational and educational activities. Herein disclosed are systems and methods for using a personal portable audio device in an aquatic environment. Although the systems described herein may be waterproof under submersible conditions, such waterproof systems may also find application in activities where contact with water is incidental. Non-limiting examples include boating, jet skiing, winter sports such as downhill and cross-country skiing, snowboarding, and sledding, and activities where the user will encounter mud such as off-road motorcycling or ATV use.

The invention disclosed herein generally relates to a waterproof enclosure for protecting electronic devices. In some embodiments, the enclosure includes a flexible waterproof bag attached to a rigid lid that can be opened to allow electronic devices to pass into the bag. When closed, the lid forms a watertight seal that protects the inside of the bag from ingress of water. The lid can include a pass-through jack which allows a user to connect an electronic device, such as an audio device, through the lid. The enclosure may be incorporated into a wearable system, such as an armband or swim-belt. In some embodiments, methods are provided for connecting an electronic device through a waterproof case so that wired or wireless electronic signals, such as audio signals, may be transmitted to the device, allowing a user to interact with and use the device while in an aquatic or otherwise extreme environment.

By providing a waterproof enclosure having a pass-through communication link on a rigid and movable cover, embodiments of the invention allow a user to quickly and easily connect an electronic device, such as an audio device, to the link outside the enclosure and then place the device inside the bag after the connection has been made. Then, once the enclosure is closed, the user can easily connect a second electronic device, such a waterproof headset, to the portion of the link disposed on the outside of the cover. In addition, affixing or otherwise coupling the communication link to the lid facilitates improved control of the cable extending into the case, thereby reducing the risk of the cable interfering with the watertight seal through accidental capture during closing of the device.

As used herein, the terms "waterproof" or "watertight" mean that the device referred to as "waterproof" or "watertight" is capable of being completely submerged under water for a substantial period of time without water penetrating a "waterproof" or "watertight" barrier. The substantial period of time may include 30 seconds, 1 minute, 1 hour, or greater than 1 hour.

As used herein, the phrase "aquatic environment" refers to an environment that is at least partially exposed to water. The exposure to water may come from being submerged or partially submerged in water or may come from exposure to droplets or streams of water, such as caused by splashing.

As used herein, the phrases "aquatic activity" or "watersports" refers to any activity in which the participant is exposed to an aquatic environment as defined above.

In one embodiment, a waterproof enclosure is provided which comprises both flexible and rigid parts. The "flexible" parts can be made from any material which is flexible enough to adapt somewhat to the shape of an electronic device, but which also prevents passage of water through the material. Such a material can be selected to be flexible enough to allow a user to interact with the device through the material, for example, by pressing a button or switch on the device through the material, or by "touching" a touchscreen or touchpad through the material with a finger or stylus. The flexible material can comprise, for example, polyurethane or PVC. The "rigid" parts can be made from any substantially rigid material, including but not limited to metal, ceramics, glass, rubber or a plastic composition such as, for example, a polycarbonate or polyurethane.

Figure 1:
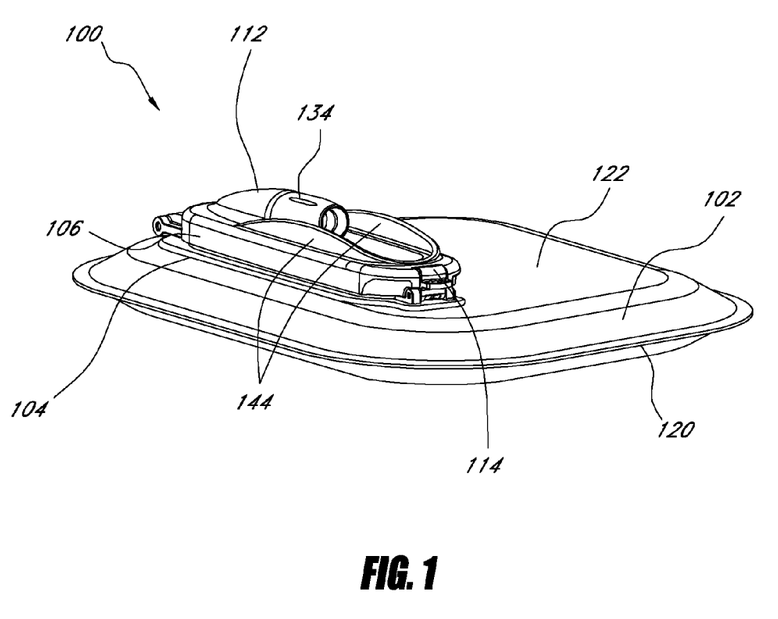
FIG. 1 shows a perspective view of a waterproof enclosure according to an embodiment, shown in closed position.
Figure 2:
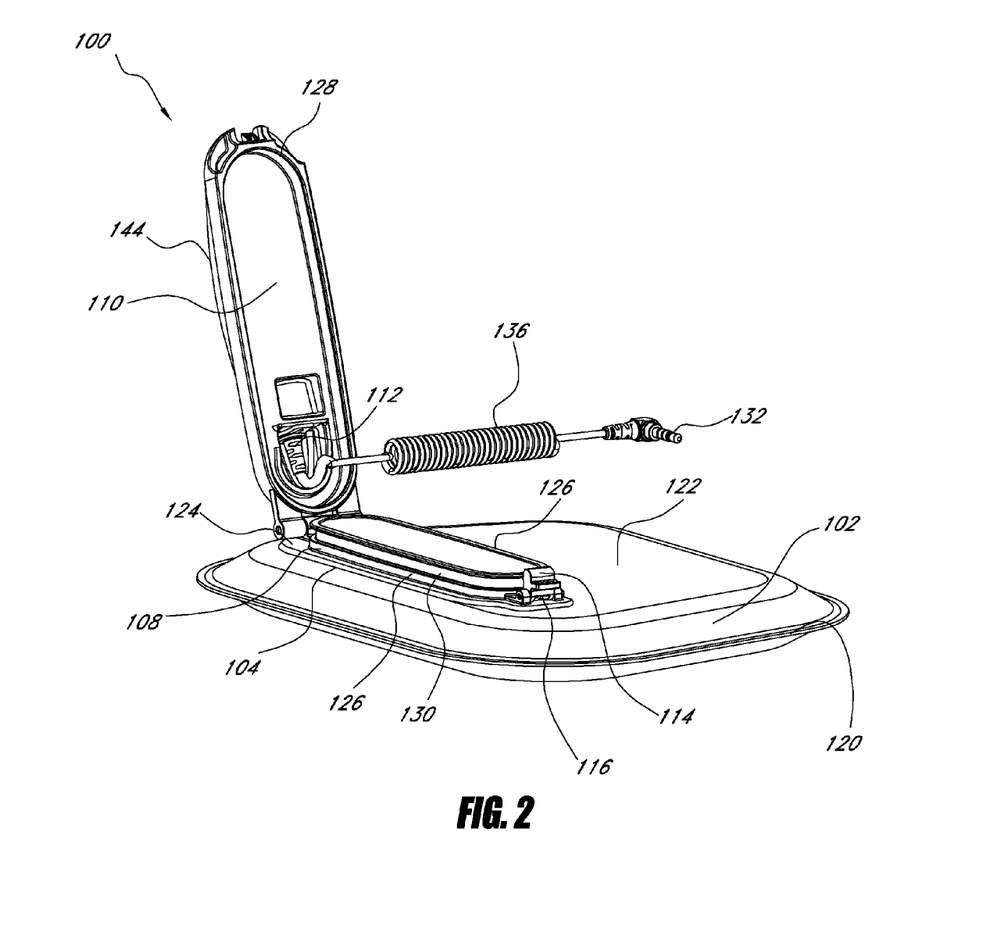
FIG. 2 shows a perspective view of the waterproof enclosure of FIG. 1, shown in open position.

With reference now to FIGS. 1 and 2, a waterproof enclosure 100 according to an embodiment is illustrated. The enclosure 100 generally includes a flexible bag 102 with an opening 104 and a lid 106 attached to the bag 102 at the opening 104. The bag 102 is configured to house an electronic device, such as an electronic music player or mobile phone (not shown). The opening 104 can have a generally oblong shape, or any other suitable shape, so as to allow passage of the electronic device through the opening 104 and into the bag 102.

The lid 106 comprises a rigid frame 108 and a cover 110 which is coupled to the rigid frame 108. The rigid frame 108 forms a watertight seal with the opening 104 in the bag 102, and reinforces the configuration of the opening 104. The cover 110 is movable between an open position (see FIG. 2) and a closed position (see FIG. 1). The cover 110 includes an electronic communication link 112 configured to provide an electronic connection between an electronic device disposed inside the bag 102 and another disposed outside of the bag 102. The lid 106 also includes a latching mechanism 114 configured to releasably lock the lid 106 in the closed position. The illustrated latch 114 includes a spring-loaded hinged portion 116 disposed on the frame 108. The hinged portion 116 cooperates with a protrusion 118 (see FIGS. 5A through 5C) that projects from the cover 110 to releasably lock the lid 106 in place. Of course, the latching mechanism 114 can have any other configuration consistent with its intended purpose.

In some embodiments, the flexible bag 102 comprises a single folded sheet or two sheets of any appropriate flexible and waterproof material. A soft material can be used so as to prevent scratching of the contents of the bag. The sheet or sheets can be joined together in any suitable fashion to form a watertight seal around the edges 120 (if any) of the bag 102. For example, the sheet or sheets can be RF welded around the edges 120. The flexible bag 102 preferably includes a transparent or semi-transparent portion 122 allowing a user to see a display portion of the device when it is placed inside the bag 102. In some embodiments, such a portion 122 may be constructed from thin polycarbonate with an anti-scratch coating. The bag 102 can optionally include a padded or inflatable border configured to secure and protect the contents of the bag from impact. In addition or in the alternative, the bag 102 can include an internal guide or tray to aid in proper positioning and securement of a device inside the bag. Such a guide or tray can be removable, and can be provided in multiple shapes and sizes so as to fit various devices. The bag can optionally include one or more spacers or dividers so as to create multiple compartments inside the bag, such as, for example, separate compartments to hold an electronic device and any excess cable running to the device. Additionally or alternatively, one or more fixed or removable pockets can be provided on the interior of the device, for example to hold excess cable, dessicant, or other items. To provide additional waterproofing protection, the bag 102 can have a dual chamber design with a separately sealed inner chamber. In some embodiments, the inner and/or outer surfaces of the bag can be treated with a water-repellent or anti-fog treatment. In some embodiments, the bag 102 is constructed from or includes an area that comprises a breathable membrane material that allows airflow through the bag 102 material while still providing water resistance. In some embodiments, in interior area of the bag 102 is configured to attract and/or sequester any moisture from a leak. For example, a sponge may be provided to soak up moisture. Alternatively, a 1-way check valve may separate an individual compartment in which water can collect. In another embodiment, a shelf or other support member is provided within the bag 102 to separate any electronic device from areas where water is likely to collect.

The flexible bag may also be configured using materials, such that the waterproof nature of the bag is possible, but materials may be laminated on either the inside or outside of the bag for a variety of functional enhancements. In one scenario, Velcro® fasteners may be laminated onto the outside of one half of the bag facilitating attachment to the wearable device. In another embodiment, the inside portion of the bag might be a soft protective material, such as cotton or felt, while the outer material can still be a waterproof material, such as polyurethane or PVC. This material flexibility will allow the device to be constructed for a variety of contents and a variety of situations.

The bag 102 may have a variety of shapes and sizes to accommodate a variety of electronic devices. In some embodiments, the bag 102 size and/or shape may be adjustable as desired. In one embodiment, gussets may be provided to increase the interior volume provided by the bag 102

The opening 104 and the lid 106 are positioned on the bag 102 such that the device can be moved away from the lid 106 after the device is placed inside the bag 102. In this way, the lid 106 can be closed without the risk of pressure being placed on the device. Further, such a configuration prevents the lid 106 from obstructing a user's view of the device through the bag 102.

The rigid frame 108 includes a sealing flange 124 which extends generally in the plane of a surface of the bag 102. The sealing flange 124 can include portions extending around the opening 104 and along both the outer surface and the inner surface of the bag 102, and forms a watertight seal between the frame 108 and the bag 102. The sealing flange 124 can be attached to the opening 104 in any suitable manner, for example by RF welding. The rigid frame 108 also includes a collar 126 which extends generally normal to the sealing flange 124 and away from the bag 102.

The cover 110 is coupled to the rigid frame 108 so as to be movable between an open position, in which the cover 110 is disposed away from the opening 104 (see FIG. 2), and a closed position (see FIG. 1) in which the cover 110 forms a watertight seal with the rigid frame 108. In the illustrated embodiment, the cover 110 includes a channel 128 configured to receive the collar 126 of the frame 108 when the device 100 is in the closed position, and the collar 126 is surrounded by a sealing element 130 which forms a watertight seal with the cover 110 in the closed position. The sealing element 130 can be an o-ring, T-seal, x-ring, square ring, delta ring, gasket, film, or any other suitable type of sealing element, and can comprise any suitable material, such as, for example, silicone rubber. Examples of sealing configurations include static gland seals, compressive groove seals, seat seals, or any mechanical assembly by which the lid and base apply compressive force to compress a compliant sealing member. Of course, a sealing element can be provided in the cover 110 instead of the frame 108. In addition, the cover 110 and the frame 108 can include any additional or alternative corresponding structure so as to form a watertight seal in the closed position. Further, although the illustrated cover 110 is pivotably movable with respect to the frame 108 in a generally longitudinal direction (that is, about a laterally-extending axis of the frame 108), alternative embodiments can include a cover which is movable in a lateral direction (that is, about a longitudinally-extending axis of the frame 108). The cover 110 and the frame 108 can be hingedly coupled, as illustrated in FIGS. 1 and 2, or can be movably coupled in any other suitable manner. For example, the cover 110 and the frame 108 can be slidingly coupled. Alternatively or in addition, the cover 110 and the frame 108 can be coupled with one or more tethers. Further, although the illustrated cover 110 includes a single piece, some embodiments can include a cover comprising two or more portions which are movable (independently or together) with respect to the frame.

Attached to the cover 110 is an electronic communication link 112. The electronic communication link 112 is configured to removably couple to an electronic input/output device disposed outside of the bag 102. In the illustrated embodiment, the electronic communication link 112 includes an audio communication link 112, such as, for example, a 4-pin, 3.5 mm audio jack. In the embodiment shown, the electronic communication link 112 is configured to interface with an external device, such as a set of audio headphones, or an audio headset with a 3.5 mm stereo plug. Most portable audio devices are constructed with a 3.5 mm stereo jack, and that is replicated by the 3.5 mm stereo jack featured on the lid 106 of this embodiment. The jack 112 is disposed on an outer surface of the cover 110, and connects through the cover 110 to a plug 132 which is connected to an inner surface of the cover 110. The plug 132 is configured to connect to a jack in the electronic device to be placed inside the bag 102. The illustrated embodiment also includes an elastomeric boot 134 designed to form a waterproof seal with a plug of certain headphones, such as H2O Audio® waterproof headphones. The boot 134 is removable to allow connection to a standard headset or headphones featuring a 3.5 mm connector.

In one alternative embodiment, an electronic communication link is formed by an electrical cable passing through the cover 110. A compression fitting may be provided between the cable and the cover to provide a waterproof seal.

Figure 3A:
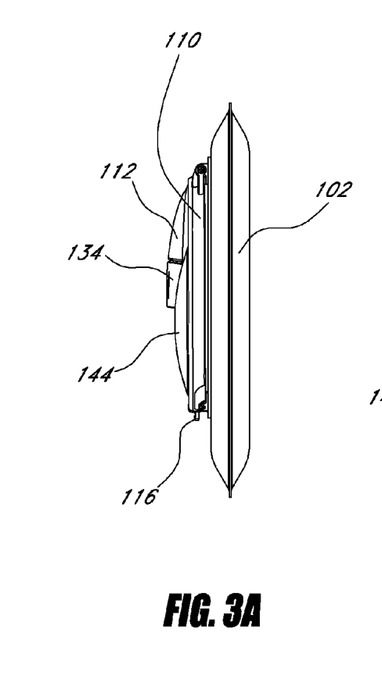
FIG. 3A is a side elevation of the enclosure of FIG. 1.
Figure 3B:
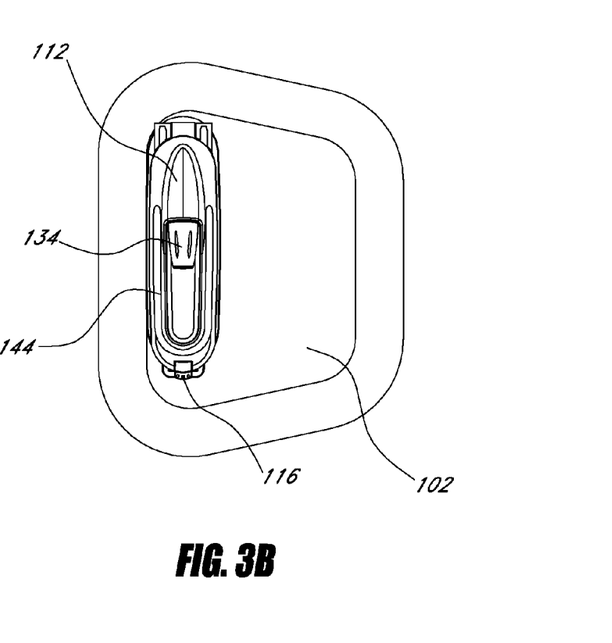
FIG. 3B is a top plan view of the enclosure of FIG. 1.
Figure 3C:
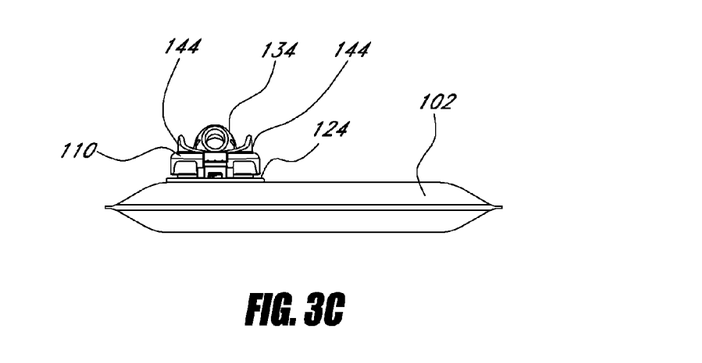
FIG. 3C is an end view of the enclosure of FIG. 1.
Figure 4A:
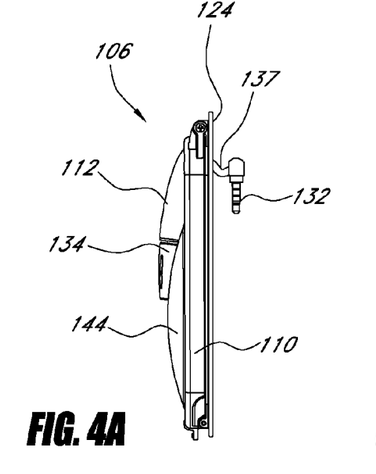
FIG. 4A is a side elevation of the lid 106 portion of the enclosure of FIG. 1.
Figure 4B:
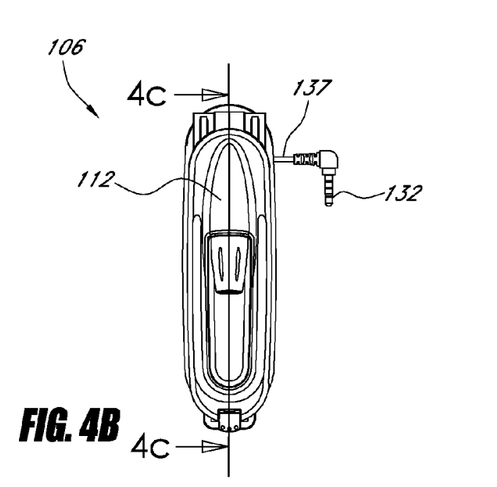
FIG. 4B is a top plan view of the lid 106 portion shown in FIG. 4A.
Figure 4C:
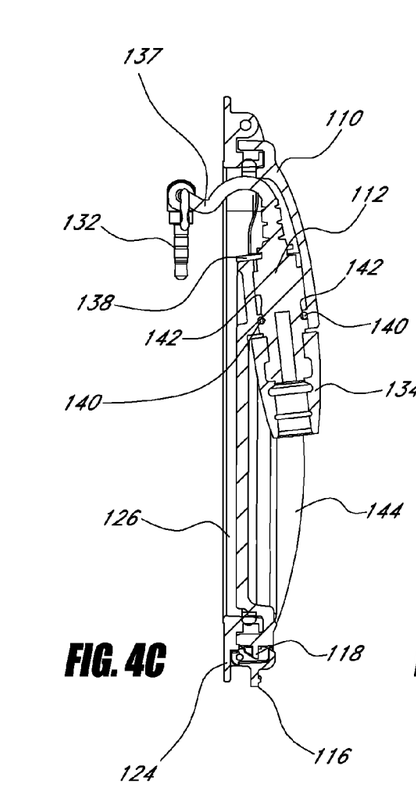
FIG. 4C is a section view of the lid 106 portion shown in FIG. 4A taken along line 4C-4C of FIG. 4B.
Figure 4D:
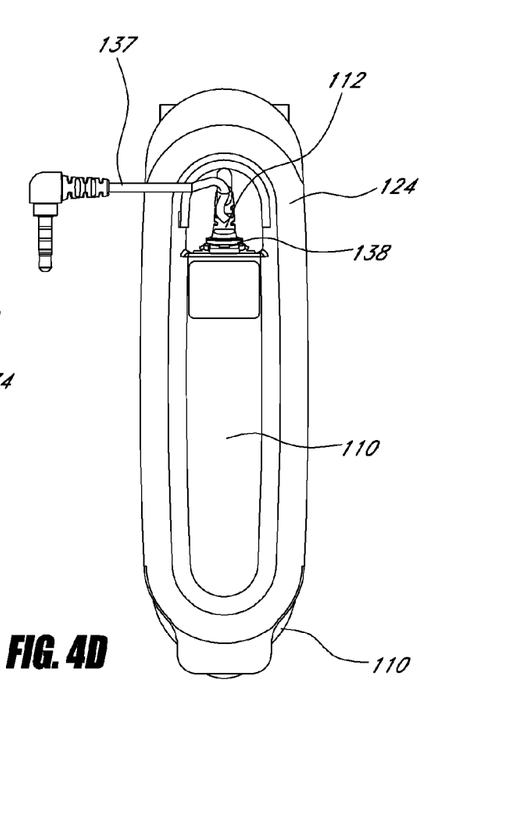
FIG. 4D is a bottom plan view of the lid 106 portion shown in FIG. 4A.

The cover 110 can also include one or more features to facilitate gripping of the cover 110 and moving the cover 110 from a closed to an open position. For example, the illustrated embodiment includes two rails 144, one disposed on either side of the jack 112. The rails 144 project in a generally transverse direction from the outer surface of the cover 110, and are configured to facilitate gripping of the cover 110 while also protecting the jack 112 somewhat from impact. FIGS. 3A, 3B, and 3C show a side elevation, a top plan view, and an end view, respectively, of the enclosure illustrated in FIG. 1. These figures better illustrate the configuration of the rails 144, the boot 134, and the collar 126 and flange 124 of the frame 108.

FIGS. 4A through 4D, which are shown with a straight cable 137 instead of the coiled cable 136 shown in the previous figures, illustrate the lid 106 in further detail. As can be seen in these figures, the lid 106 and/or the electronic communication link 112 may include one or more features configured to secure the link 112 to the lid 106. In the illustrated embodiment (see FIG. 4C), a snap-ring 138 is provided to secure the link 112 in place on the cover 110. Of course, any other suitable means can be provided to secure the link 112 in place, including adhesives and/or other mechanical fasteners. In addition, a sealing element 140 is disposed between the communication link 112 and the lid 106 to provide a waterproof coupling between the link 112 and the lid 106. The sealing element 140 can comprise, for example, one or more o-rings surrounding the link 112 which are received in corresponding seal glands 142 in the lid 106. Of course, the lid 106 and/or link 112 can include any other features configured to provide a waterproof seal between the lid 106 and the link 112.

Figures 5A, 5B, 5C:
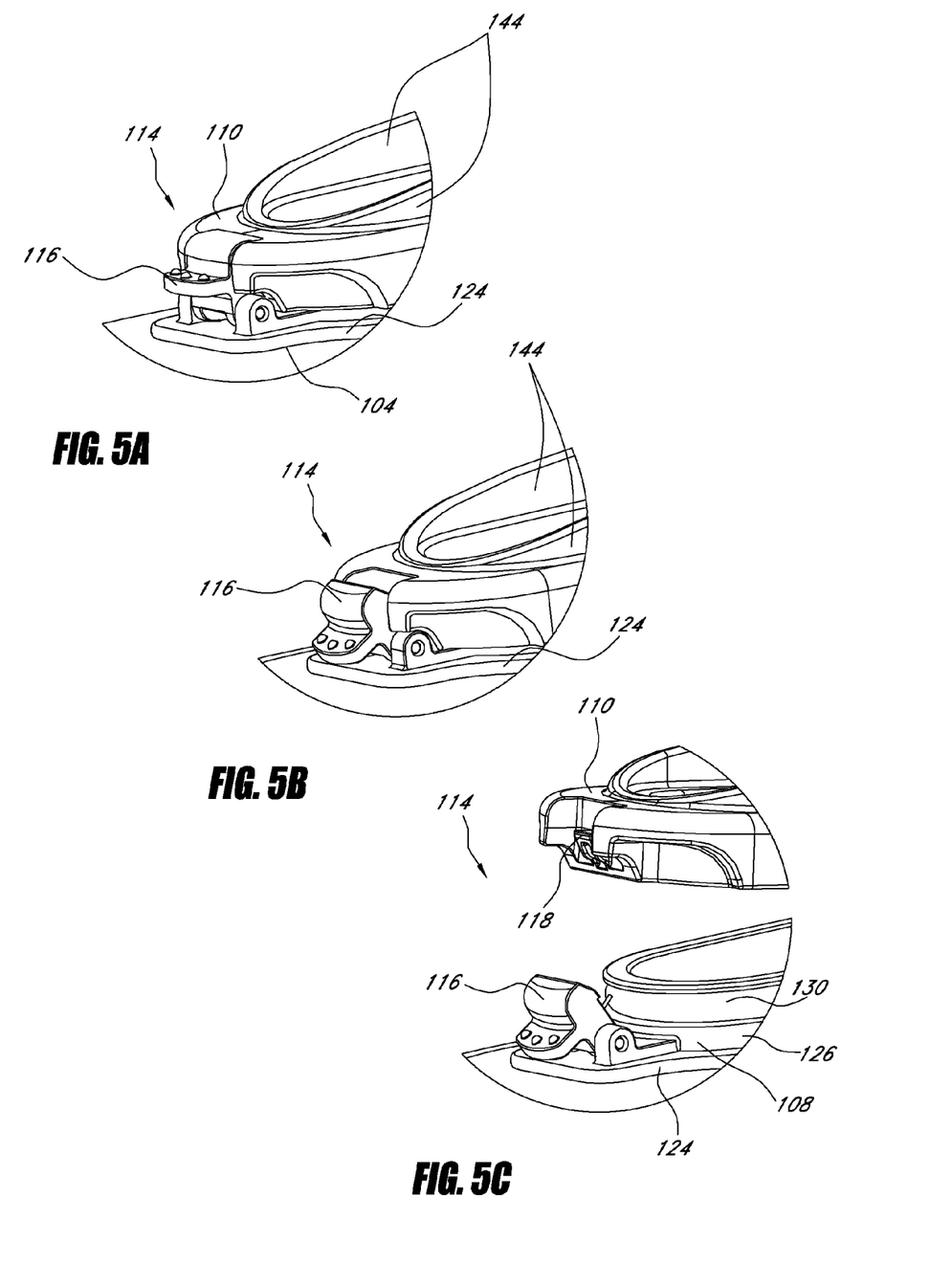
FIG. 5A is a cutaway perspective view of the latch shown in FIG. 1, illustrating the cover 110 and frame 108 in closed and locked position.
FIG. 5B is a cutaway perspective view of the latch of FIG. 5A, shown in closed and released position.
FIG. 5C is a cutaway perspective view of the cover 110 and frame 108 shown in FIG. 5A shown in an open and unlatched position.

FIGS. 5A through 5C illustrate the latch 114 and its operation in further detail. FIG. 5A shows the lid 106 in a closed position with the latch 114 in a locked position. FIG. 5B shows the lid 106 in a closed position with the hinged portion 116 of the latch depressed. FIG. 5C shows the lid 106 in an open position, and also illustrates the configuration of the sealing flange 108 and collar 126 of the frame 108.

Figure 6:
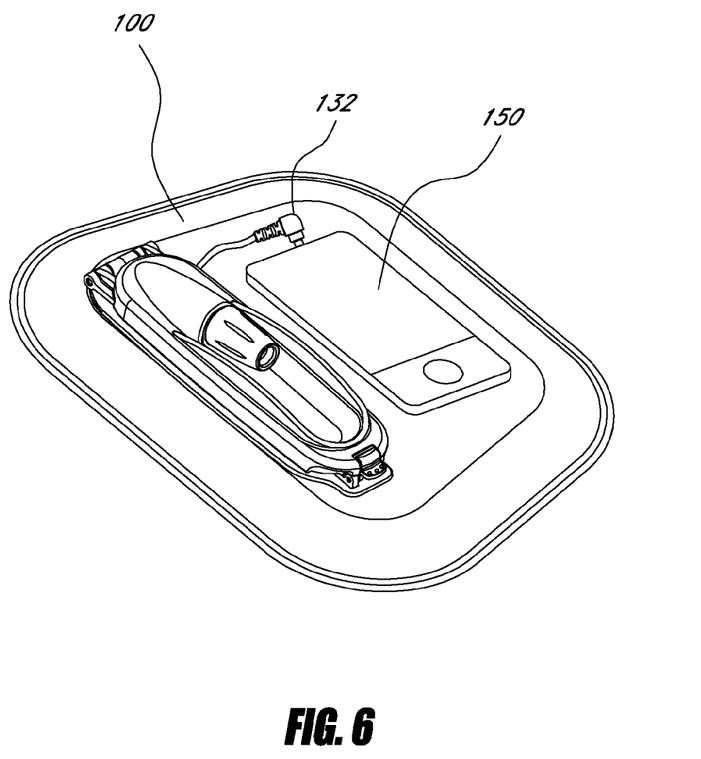
FIG. 6 is a perspective view of an enclosure configured in accordance with an embodiment, shown connected to and housing an exemplary electronic device.

In FIG. 6, the enclosure 100 illustrated in FIGS. 1 and 2 is shown housing an exemplary electronic device 150, with the plug 132 connected to the device 150.

In some embodiments, the plug 132 can be, for example, a 4-pin, 3.5 mm audio plug, which would allow for connection of a wide range of existing electronic audio devices, including the Apple® iPhone. In addition, using a 4-pin connector would allow the transmission of an audio signal both to and from the device. Of course, the plug can comprise any other suitable type of connector. The plug 132 can be connected to the cover 110 via a cable 136, such as the illustrated coiled cable 136. The length and specification of the cable 136 can vary depending on the particular application. In the illustrated embodiment, the cable 136 is coiled to allow for flexibility when the enclosure 100 is open, while regulating any excess amount of cable 136 when a device is connected to the plug 132 and placed inside the bag 102.

The orientation of the electronic communication link 112 can vary depending upon the particular application. In the embodiment illustrated in FIGS. 1 and 2, the electronic communication link 112 is disposed longitudinally with respect to the cover 110, and is so oriented to reduce the overall width of the rigid lid 106. In combination with a hinged or otherwise movable coupling between the cover 110 and the frame 108, such a configuration facilitates opening 104 and closing of the enclosure 100 during activity and when worn on a contoured portion of the body, such as an arm or waist. In addition, the orientation of those portions of the link 112 that are disposed on the inner and outer surfaces of the cover 110 can vary. For example, the jack 112 extending from the outer surface of the cover 110 can extend generally longitudinally with respect to the cover 110, as shown in the illustrated embodiment, or the jack 112 can extend laterally with respect to the cover 110. Alternatively, the jack 112 can project generally transversely from the cover 110. Similarly, the portion of the link 112 extending from the inner surface of the cover 110 can have any of these orientations. In addition, the portions of the link 112 extending from the outer and inner surfaces of the cover 110 can be disposed in the same general direction as the direction in which the cover 110 is movable. In the illustrated embodiment, for example, the jack 112 and the cable 136 extend generally longitudinally from the cover 110 which is movable in the longitudinal direction. In alternative embodiments, either or both of the inner and outer portions of the link 112 can extend in a direction nonparallel to or normal to the direction in which the cover 110 is movable.

Figure 7A:
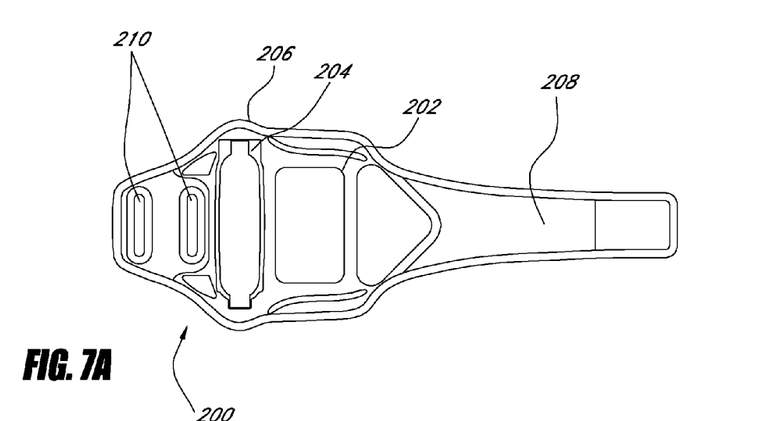
FIG. 7A is a top plan view of a wearable article comprising an armband designed to receive a waterproof enclosure configured in accordance with an embodiment, shown before the waterproof enclosure is installed.
Figures 7B, 7C:
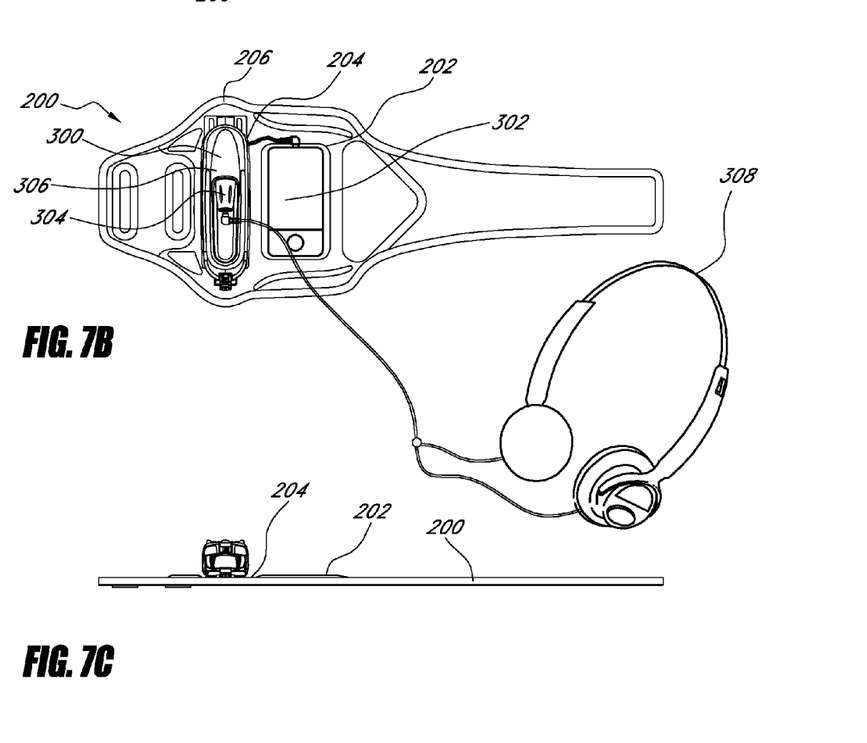
FIG. 7B is a top plan view of the armband of FIG. 7A, shown housing an exemplary audio device with the device electrically connected to an exemplary headset disposed outside of the enclosure.
FIG. 7C is a side view of the armband and enclosure of FIG. 7B.

As illustrated in FIGS. 7A through 7C, embodiments of the invention can be incorporated with a wearable article 200, such as an armband. FIG. 7C shows the article 200 securing an enclosure 300 according to an embodiment. The enclosure 300 is shown housing an exemplary electronic device 302 which is connected, through a link 304 on a lid 306 of the enclosure 300, to an external headset 308. The wearable article 200 can be configured with an opening 202 or a transparent window so that the device 302, once placed inside the enclosure 300, is visible through the article 200. The article 200 can also include a second opening 204 configured to allow the lid 306, or a portion thereof, to protrude or extend through the article 200 so that a user can access the lid 306 when the enclosure 300 is retained in the article 200. The article 200 can be provided with one or more contours 206 around or near the lid 106. The armband 200 can include one or more straps 208 and slits 210 to facilitate securement of the armband 200 to a wearer's arm. In addition or in the alternative, the armband 200 can include hook and loop fasteners, such as Velcro®, on one or more of its surfaces to facilitate such securement. Of course, the armband 200 can be configured for securement to the arm in any other suitable fashion. In some embodiments, the enclosure 300 is reversibly secured to the wearable article 200 such as by Velcro features laminated on the enclosure 300. In another embodiment, the enclosure 300 is secured to the wearable article 200 using rivets.

Figure 8:
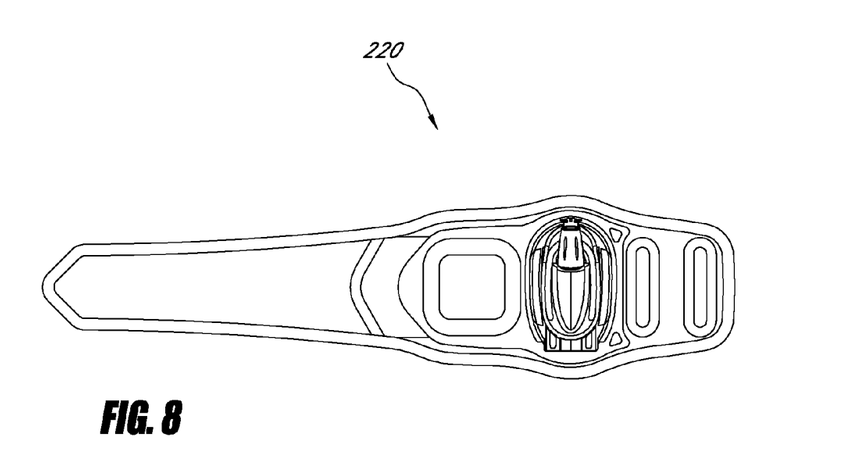
FIG. 8 is a top plan view of a wearable article comprising an armband configured to receive a waterproof enclosure, in accordance with a further embodiment.

FIG. 8 illustrates an armband 220 according to an alternative embodiment. The armband 220 is configured to house an electronic device that is smaller than the device 302 illustrated in FIGS. 7A through 7C.

Figure 9:
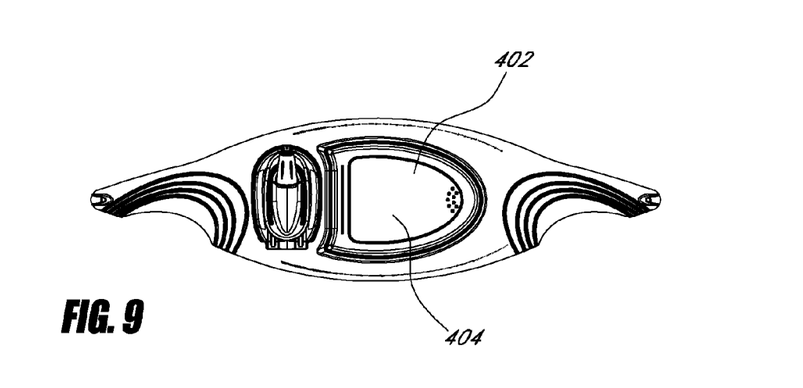
FIG. 9 is a top plan view of a wearable article comprising a headband configured to receive a waterproof enclosure, according to another embodiment.

With reference now to FIG. 9, a wearable article 400 is shown housing an enclosure 402, according to an alternative embodiment. The article 402 comprises a headband configured to house a waterproof enclosure 402. The enclosure 402 includes a flexible bag 404 and a rigid lid 406. The enclosure 402 can be configured similarly to the enclosure 100 described herein, but need not include all of the features described in connection therewith. Further, the size and shape of the enclosure 402 and the rigid lid 404 can be adapted to the configuration of the headband 400. Embodiments of the invention can also be configured for use with a variety of other wearable articles, including waistbelts or swimbelts, shirts, vests, and wetsuits.

In some embodiments, the wearable article may include additional features such as cord management devices. For example, hooks or other features may be provided to secure excess cable to the wearable article. Other attachment features may also be provided for securing other articles to the outside of the wearable article. In some embodiments, the wearable article may provide rigid or semi-rigid reinforcement to provide impact protection to an electronic device within an enclosure attached to the wearable article. The wearable article may also provide features to specifically protect the screen of an electronic device. For example, a neoprene door or flap may be provided to cover the screen area of the device when it does not need to be accessed. The wearable article may also include floatation devices such that it floats (even when containing an electronic device) should the article become separated from the user. In one embodiment, the wearable article incorporates a charger to facilitate charging of an electronic device. In some embodiments, the wearable article includes multiple openings and/or enclosure attachment areas to provide flexibility and the positioning or access direction of an enclosure. In some such embodiments, multiple enclosures, and hence multiple electronic devices, may be secured to a wearable article.

In some cases the wearable article might be useful without the waterproof enclosure for environments outside of an aqueous environment. For example, an armband might function as a general armband for running and cycling in dry environments without the waterproof enclosure, and will also function as a waterproof armband when assembled with the waterproof enclosure. This provides the user with a more flexible product, and reduces the overall number of products required to achieve the same functional result. Thus, some embodiments include a wearable article that can be used with or without the waterproof enclosure.

In some embodiments, a device is provided designed to receive an enclosure described above (for example, in a manner similar to the wearable articles described above) which may then be reversibly attached to a wearable article such as an armband, shirt, life jacket, etc. In some embodiments, the reversible attachment is facilitated by a zipper or other attachment feature. Some embodiments provide the device and a zipper pattern such that a user or manufacturer can attach the device to any desired wearable article. Other embodiments provide buckles to facilitate reversible attachment of an enclosure receiving device to wearable articles.

Figure 10A:
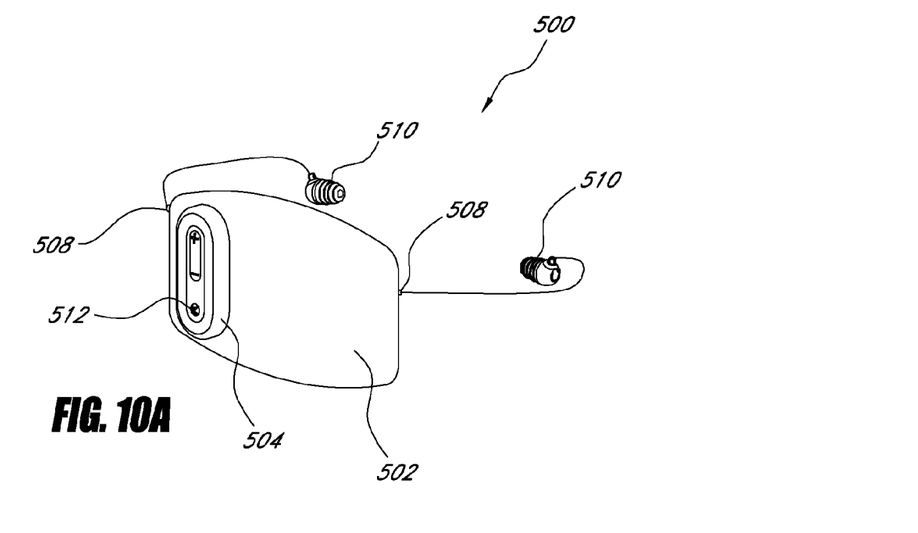
FIG. 10A is a perspective view of a waterproof enclosure configured in accordance with a further embodiment, with a communication link exiting directly through the flexible portion of the enclosure and connected to audio headphones.
Figure 10B:
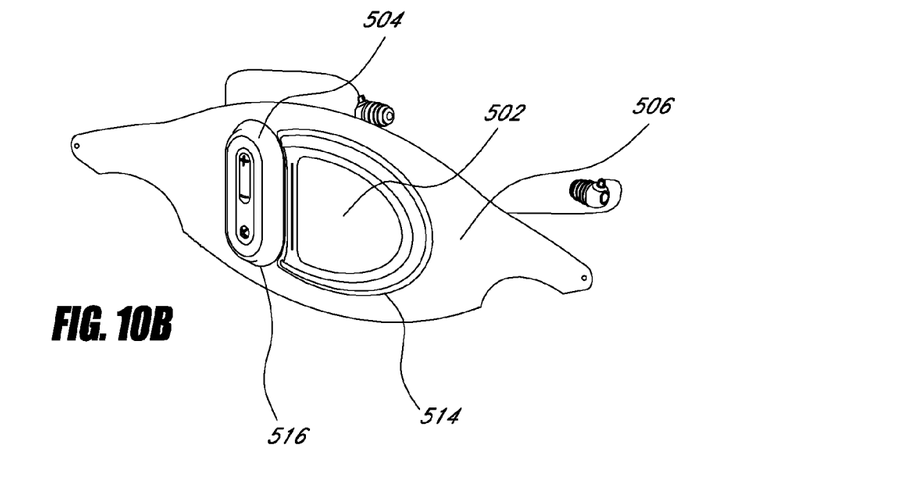
FIG. 10B is a perspective view of a wearable article comprising a headband configured to receive the waterproof enclosure of FIG. 10A, according to further embodiment.

In some embodiments, the electronic communication link can be attached elsewhere on the enclosure than the cover. For example, FIGS. 10A and 10B illustrate an enclosure 500 according to such an embodiment. The enclosure 500 includes a flexible bag 502 and a rigid lid assembly 504, and is configured for use with a headband 506 (see FIG. 10B). The enclosure 500 includes one or more electronic communication links 508 which exit the bag 502 through features that incorporate the links 508 into the welded seam of the bag 502. The communication links 508 in the illustrated embodiment are connected to external headphones 510. Waterproof controls 512, such as for Volume Increase, Volume Decrease, and Mute, are disposed on an outer surface of the lid 504. Such a configuration allows the user to easily locate often-used controls without removing the headband 506 and without viewing the contents of the bag 502. This configuration is advantageous for a swimmer who would preferably attach this assembly to their swim goggles, and will need to control these functions by touch. FIG. 10B shows the enclosure 500 installed in the headband 506, with at least a portion of the bag 502 visible through a first window 514 in the bag, and with at least a portion of the lid 504 protruding from a second window 516. Of course, in some applications, the bag 502 need not be visible through the headband 506, and so the window 514 is an optional feature. Incorporating the enclosure 500 into the headband 506 facilitates its attachment to a pair of swim goggles, and maintains a more comfortable fit on the head.

In any of the embodiments described herein, a protection member to resist the possible transmission of force of impact to the electronic device held within the enclosure may be included. In some embodiments, the protection member can comprise one or more rigid, semi-rigid, or soft protection shields. In some embodiments, the protection member can comprise a rigid or semi-rigid grid or grate. In some embodiments, the protection member can cover the entire electronic device, or just a portion of the device, such as a portion of the device that is most susceptible to suffering damage from impact. One example of such a portion is an LCD screen.

The protection member can be incorporated into a wearable article configured to retain the enclosure. The protection member can optionally be removable from the wearable article. In some embodiments, the protection member can be removably or permanently attached to the waterproof enclosure itself. In preferred embodiments, the protective member is configured so as not to interfere with the opening of the enclosure. For example, in some embodiments, the protective member is configured to be easily and quickly moved away from the enclosure (so that a user can interact with the device), and easily and quickly moved back (so that the user can continue his activity).

A variety of additional features can be included in embodiments of the invention. For example and without limitation, embodiments of the invention can include elements such as antennae, batteries, controls, dessicant, lighting, speakers (such as waterproof speakers), and/or wireless communication technology (such as Bluetooth™ technology) coupled to or integrated with the flexible bag and/or the rigid lid. Other items that can be integrated with or coupled to the flexible bag or rigid lid in certain embodiments include a pedometer, swim pedometer, thermometer, compass, water analyzer (to detect pollution, for example), clock, and/or timer. In some embodiments, lid or bag may include a duckbill check valve to allow for pressure equalization. Other features may include solar cells located on the outside of the bag or wearable member to power any electronic device placed within the bag. In still other embodiments, a rigid or semi-rigid internal shell may be placed within the bag to withstand increased pressures (e.g., from submersion to significant depths). In some such embodiments, the shell is removable.

In one embodiment, an electronic pump is placed within the waterproof bag described herein. An electronic link through the lid may be provided for powering and/or controlling the pump. In one such embodiment, a fluid tube passes through the lid or bag such that the pump can draw and expel fluid from outside of the bag. In one embodiment, a waterproof seal is formed at the interface of the tube and the bag or lid, such as by a compression fitting.

In some embodiments, the communication link can extend through a hingepoint between the cover and the frame, offering accessibility to the link from both above and below the cover. In some embodiments, the link itself can include volume controls.

To use embodiments of the invention, a user can release any locking mechanism provided on the lid and then move the cover to an open position. In the embodiment illustrated in FIG. 1, for example, a user can press down on the hinged portion 116 of the latch 114 and then lift the cover 110 up, for example by gripping the rails 144 on the sides of the cover 110 (see also FIGS. 5A through 5C). When the enclosure 100 is in the open position, the user can connect an electronic device, such as an audio device, to the plug 132 extending from the inner surface of the cover 110. The user can then pass the device through the rigid frame 108 defining the opening 104 in the bag 102. The user can easily move the device to an appropriate position so that any display portion of the device is visible through the transparent window 122 of the bag 102. Any extra cable is also placed into the bag 102, and the cover 110 is then moved down into a closed and latched position on the frame 108. In the illustrated embodiment, the latch 114 is configured to allow the cover 110 to move into the closed position and automatically latch with the application of slight downward pressure. The user can then attach an external device, such as waterproof headset, to the jack 112 provided on the outer surface of the cover 110. The user can then listen to the audio device in an aquatic environment while protecting the device from exposure to water. In applications in which the external device includes an input such as a microphone, the user can also communicate information to the device through the link 112. In applications in which the device includes a touchscreen portion, the user can also communicate information to the device by touching the device through the transparent portion of the bag 102.

Although illustrated in the context of an enclosure for holding a personal audio device, embodiments of the invention can be adapted for use with any electronic device, including larger-scale devices such as laptops and personal computers. Embodiments of the present invention have been shown and described with a degree of particularity to enable their complete and full understanding. It should be understood, however, that the present invention embodies the inventive concepts as defined by the claims, and is not limited by any detailed description herein.

What is claimed is:

1. A waterproof enclosure adapted to receive a first electronic device, the enclosure comprising:
    a flexible waterproof bag;
    a rigid frame attached to the bag, the rigid frame defining an opening larger than a cross-section of the first electronic device; and
    a rigid cover operatively coupled to the rigid frame, the cover being movable between an open position, in which the cover is disposed away from the opening, and a closed position, in which the cover forms a waterproof seal with the frame.

2. The waterproof enclosure of claim 1, further comprising a water resistant electronic communication link passing through at least one of the frame and the cover, the link being configured to allow an electronic connection between the first electronic device when it is placed inside the bag and a second electronic device disposed outside of the bag.

3. The waterproof enclosure of claim 2, wherein the electronic communication link is an audio communication link.

4. The waterproof enclosure of claim 2, wherein the electronic communication link passes through the frame.

5. The waterproof enclosure of claim 2, wherein the electronic communication link passes through the cover.

6. The waterproof enclosure of claim 5, wherein an outer portion of the electronic communication link is recessed in an outer portion of the cover.

7. The waterproof enclosure of claim 2, wherein the second electronic device is a waterproof headset.

8. The waterproof enclosure of claim 2, wherein the cover comprises an audio jack connected to the electronic communication link.

9. The waterproof enclosure of claim 2, wherein the bag comprises at least one generally planar wall, the frame being substantially coplanar with the wall.

10. The waterproof enclosure of claim 2, further comprising a cable extending from an inner portion of the electronic communication link, the cable being configured to allow connection of the electronic device to the electronic connection link while the cover is in the open position, before the electronic device is received in the bag.

11. The waterproof enclosure of claim 10, wherein the cable comprises an audio plug.

12. The waterproof enclosure of claim 1, wherein the bag comprises polyurethane.

13. The waterproof enclosure of claim 1, wherein the bag comprises PVC.

14. The waterproof enclosure of claim 1, wherein the bag comprises silicone.

15. The waterproof enclosure of claim 1, wherein the frame comprises a flange.

16. The waterproof enclosure of claim 15, wherein the cover comprises a channel configured to received a collar extending generally normal to the flange when the cover is in the closed position.

17. The waterproof enclosure of claim 1, wherein the frame is RF welded to the bag.

18. The waterproof enclosure of claim 1, wherein the frame is heat sealed to the bag.

19. The waterproof enclosure of claim 1, wherein the frame is clamped to the bag.

20. The waterproof enclosure of claim 1, wherein an adhesive is disposed between the frame and the bag.

21. The waterproof enclosure of claim 1, further comprising one or more fasteners securing the frame to the bag.

22. The waterproof enclosure of claim 1, wherein the cover is coupled to the frame by a hinge.

23. The waterproof enclosure of claim 1, wherein the cover is coupled to the frame by a tether.

24. The waterproof enclosure of claim 1, further comprising a latch configured to hold the cover in the closed position.

25. The waterproof enclosure of claim 24, wherein the latch is configured to lock the cover in the closed position.

* * * * *